United States Patent
Xu et al.

(10) Patent No.: US 8,822,292 B2
(45) Date of Patent: Sep. 2, 2014

(54) METHOD FOR FORMING AND CONTROLLING MOLECULAR LEVEL SIO2 INTERFACE LAYER

(75) Inventors: Qiuxia Xu, Beijing (CN); Gaobo Xu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 209 days.

(21) Appl. No.: 13/502,788

(22) PCT Filed: Feb. 28, 2012

(86) PCT No.: PCT/CN2012/071703
§ 371 (c)(1),
(2), (4) Date: Apr. 19, 2012

(87) PCT Pub. No.: WO2013/075424
PCT Pub. Date: May 30, 2013

(65) Prior Publication Data
US 2013/0130448 A1    May 23, 2013

(30) Foreign Application Priority Data
Nov. 23, 2011   (CN) .......................... 2011 1 0375162

(51) Int. Cl.
*H01L 21/336*    (2006.01)
*H01L 29/51*    (2006.01)

(52) U.S. Cl.
CPC .............. *H01L 29/513* (2013.01); *H01L 29/51* (2013.01); *H01L 29/511* (2013.01)
USPC ............. 438/287; 257/E21.409; 257/E21.177

(58) Field of Classification Search
CPC ..... H01L 29/51; H01L 29/512; H01L 29/518; H01L 29/511; H01L 29/513
USPC .................... 257/E21.409, E21.177; 438/287
See application file for complete search history.

(56) References Cited

U.S. PATENT DOCUMENTS

| 7,189,652 B1 * | 3/2007 | Blosse et al. .................. 438/696 |
| 7,564,114 B2 * | 7/2009 | Govindarajan ............... 257/499 |
| 2007/0141797 A1 | 6/2007 | Li |
| 2008/0070395 A1 | 3/2008 | Yen et al. |

FOREIGN PATENT DOCUMENTS

| CN | 101447420 A | 6/2009 |
| CN | 101800178 A | 8/2010 |
| CN | 102237269 A | 11/2011 |

\* cited by examiner

*Primary Examiner* — Robert Huber
(74) *Attorney, Agent, or Firm* — Westman, Champlin & Koehler, P.A.

(57) ABSTRACT

The present disclosure provides a method for forming and controlling a molecular level $SiO_2$ interface layer, mainly comprising: cleansing before growing the $SiO_2$ interface layer, growing the molecular level ultra-thin $SiO_2$ interface layer; and controlling reaction between high-K gate dielectric and the $SiO_2$ interface layer to further reduce the $SiO_2$ interface layer. The present disclosure can strictly prevent invasion of oxygen during process integration. The present disclosure can obtain a good-quality high-K dielectric film having a small EOT. The manufacturing process is simple and easy to integrate. It is also compatible with planar CMOS process, and can satisfy requirement of high-performance nanometer level CMOS metal gate/high-K device of 45 nm node and below.

13 Claims, 2 Drawing Sheets

METHOD FOR FORMING AND CONTROLLING MOLECULAR LEVEL SIO2 INTERFACE LAYER

CROSS-REFERENCE TO RELATED APPLICATION

This application is a National Phase application of, and claims priority to, PCT Application No. PCT/CN2012/071703, filed on Feb. 28, 2012, entitled "METHOD FOR FORMING AND CONTROLLING MOLECULAR LEVEL INTERFACE $SiO_2$ LAYER", which claimed priority to Chinese Application No. 201110375162.X, filed on Nov. 23, 2011. Both the PCT Application and Chinese Application are incorporated herein by reference in their entireties.

FIELD

The present disclosure relates to the field of semiconductor technology, and in particular, to a method for manufacturing a metal gate/high-K (dielectric constant) dielectric layer/$SiO_2$ interface layer stack structure having an ultra-thin equivalent oxide thickness (EOT) for a CMOS device. The present disclosure mainly focuses on a method for forming a molecular level $SiO_2$ interface layer and a control method during device manufacture. The present disclosure is applicable to manufacture of high-performance nanometer level complementary metal oxide semiconductor (CMOS) devices of 45 nm node and below.

BACKGROUND

As feature sizes of CMOS devices decrease to 45 nm and below, in order to substantially reduce gate tunneling current and gate resistance, eliminate polysilicon depletion effect, improve device reliability, and mitigate Fermi energy level pinning effect, it has become a consensus of the industry to replace conventional poly-Si (polysilicon)/$SiO_2$ gate structure with metal gate/high-K dielectric layer/$SiO_2$ interface layer gate structure. However, there are still many problems of the metal gate/high-K gate dielectric layer/$SiO_2$ interface layer structure waiting to be solved. For example, the problems include thermal stability problem and interface state problem, and it is difficult to obtain a small EOT and a low threshold voltage. It is desirable to obtain a good-quality high-K gate dielectric film with a small EOT. Besides a proper high K value of the high-K gate dielectric material, interfacial engineering, i.e., formation of an ultra-thin $SiO_2$ interface layer is also very important. Otherwise it is difficult to reduce the EOT, because the K value of the $SiO_2$ interface layer is low and thus has a great influence on device performances. However, it is difficult to form the ultra-thin $SiO_2$ interface layer, because a natural oxide layer typically has a thickness of about 5-6 Å, and the $SiO_2$ interface layer may continue to grow during device manufacture.

SUMMARY

The present disclosure provides a method for forming and controlling a molecular level $SiO_2$ interface layer for a CMOS metal gate/high-K dielectric layer device, in order to at least solve the problem of reducing the EOT.

The method for forming and controlling the molecular level $SiO_2$ interface layer for the CMOS metal gate/high-K dielectric layer device provided by the present disclosure comprises:

1) a cleansing step including, after completing local oxide isolation or shallow trench isolation in Gate-First process or removing replaced gate in Gate-Last process and before forming an interface oxide layer, cleansing a wafer and immersing the wafer in HF/isopropyl alcohol/water solution at room temperature, rinsing the wafer with deionized water, spinning the wafer and then putting the wafer into a furnace immediately, wherein a volume ratio of HF:isopropyl alcohol:water is 0.15-1.5%:0.01-0.10%:1%;

2) forming the molecular level $SiO_2$ interface layer by performing rapid thermal annealing on the wafer in $N_2$ for 30-90 seconds at 500-600° C. in the Gate-Last process or at 600-800° C. in the Gate-First process;

3) forming a high-K gate dielectric film by forming the high-K gate dielectric film by physical vapor deposition or atom layer deposition, the high-K gate dielectric film may comprise one of various high-K gate dielectric films;

4) performing rapid thermal annealing, whereby the rapid thermal annealing is conducted at 500-600° C. for 30-90 seconds in the Gate-Last process or at 800-1000° C. for 20-40 seconds in the Gate-First process;

5) forming the CMOS metal gate by depositing a metal nitride gate on the high-K dielectric film by reactive magnetic sputtering utilizing physical vapor deposition;

6) depositing a barrier layer on the CMOS metal gate by reactive magnetic sputtering;

7) on the barrier layer, depositing a polysilicon film by low-pressure chemical vapor deposition in the Gate-First process and depositing low-resistance metal by magnetic sputtering in the gate-Last process;

8) etching a product of the step 7) by plasma etching with Cl-base gas, F-base gas, or a mixture thereof, using a mask having a gate photolithography pattern, to form a polysilicon/CMOS metal gate film/high-K dielectric film/molecular level $SiO_2$ interface layer gate stack structure or a CMOS metal gate/high-K dielectric film/molecular level $SiO_2$ interface layer gate stack structure, respectively;

9) depositing silicon nitride on a product of the step 8) by plasma chemical vapor deposition at 300-400° C., the silicon nitride having a thickness of 200-600 Å;

10) etching the silicon nitride by anisotropic plasma etching to form a first silicon nitride spacer;

11) after source/drain extension implantation and forming a second spacer, performing source/drain implantation to form source/drain regions;

12) activating the source/drain regions by rapid thermal annealing: the rapid thermal annealing is performed at 950-1050° C. in $N_2$ for 1-15 seconds; and 13) forming contacts and metalizing by performing alloying annealing in $N_2$ or $N_2$+10% $H_2$ in an alloying furnace at 380-450° C.

Optionally, the cleansing in the step 1) is performed before formation of the interface oxide layer. The wafer is first cleansed by a conventional method and then is immersed in the HF/isopropyl alcohol/water solution at the room temperature for 1-8 minutes.

Optionally, in the step 2), the molecular level $SiO_2$ interface layer has a thickness of 0.5-0.7 nm.

Optionally, in the step 3), the high-K gate dielectric film has a thickness of 2-5 nm.

Optionally, in the step 3), the high-K gate dielectric film is one of a HfLaON film, a HfSiON film, and a HfSiAlON film.

Optionally, in the step 5), the metal nitride gate has a thickness of 2-40 nm, and the metal nitride gate is one of a TiN gate, a TaN gate, a MoN gate, a MoAlN gate, a TiAlN gate, and a TiGaN gate.

Optionally, in the step 6), the barrier layer has a thickness of 4-7 nm, and the barrier layer is a TaN layer or an AlN layer.

Optionally, in the step 7), the polysilicon film has a thickness of 50-120 nm, the low-resistance metal film has a thickness of 50-120 nm, and the low-resistance metal film is one of a Mo film, a W film, and a TiAl film.

The present disclosure is applicable to a metal gate/high-K dielectric layer/$SiO_2$ interface layer gate stack structure having an ultra-thin equivalent oxide thickness (EOT) of a CMOS device. The present disclosure mainly focuses on a method for forming a molecular level $SiO_2$ interface layer and a control method during device manufacture. The present disclosure can achieve a good-quality high-K gate dielectric film having a small EOT and satisfy requirements of high-performance nanometer level CMOS devices of 45 nm and below.

The method for forming and controlling interfacial engineering-ultra-thin $SiO_2$ interface layer comprise at least four inventive steps:

1) Cleansing before growth of the $SiO_2$ interface layer. The present disclosure utilizes cleansing solution comprising IPA and a small quantity of HF. In this way, dangling bands on silicon surface are saturated and passivated by H+, and generation of natural oxide and contamination of particles can be suppressed. Interface micro-roughness is also improved.

2) Proposing and implementing ultra-thin $SiO_2$ interface layer growth technology. The ultra-thin $SiO_2$ interface layer is generated utilizing a trace of oxygen contained in super pure $N_2$ during rapid thermal annealing. The technology has a good repeatability and is a key technology in achieving the good-quality high-K gate dielectric film having the small EOT.

3) Rapid thermal annealing in super pure $N_2$ after the high-K dielectric is sputtered by RF reactive magnetic sputtering. This further strengthens the high-K gate dielectric and improves the gate leakage current and interface state. Meanwhile, it reduces the thickness of the $SiO_2$ interface layer by making the high-K gate dielectric to react with the $SiO_2$ interface layer.

4) Strictly preventing invasion of oxygen during integration process. For example, after the metal gate/high-K dielectric layer/$SiO_2$ interface layer gate stack structure is etched, the metal gate/high-K dielectric layer/$SiO_2$ interface layer gate stack structure is protected by a $Si_3N_4$ spacer to avoid increasing of the EOT due to invasion of external oxygen atoms through side faces of the gate stack.

It should be noted that the drawings are only for purpose of illustration and thus should not be construed as any limitation or constrain to the scope of the present disclosure.

DETAILED DESCRIPTION OF ILLUSTRATIVE EMBODIMENTS

Figure 1:
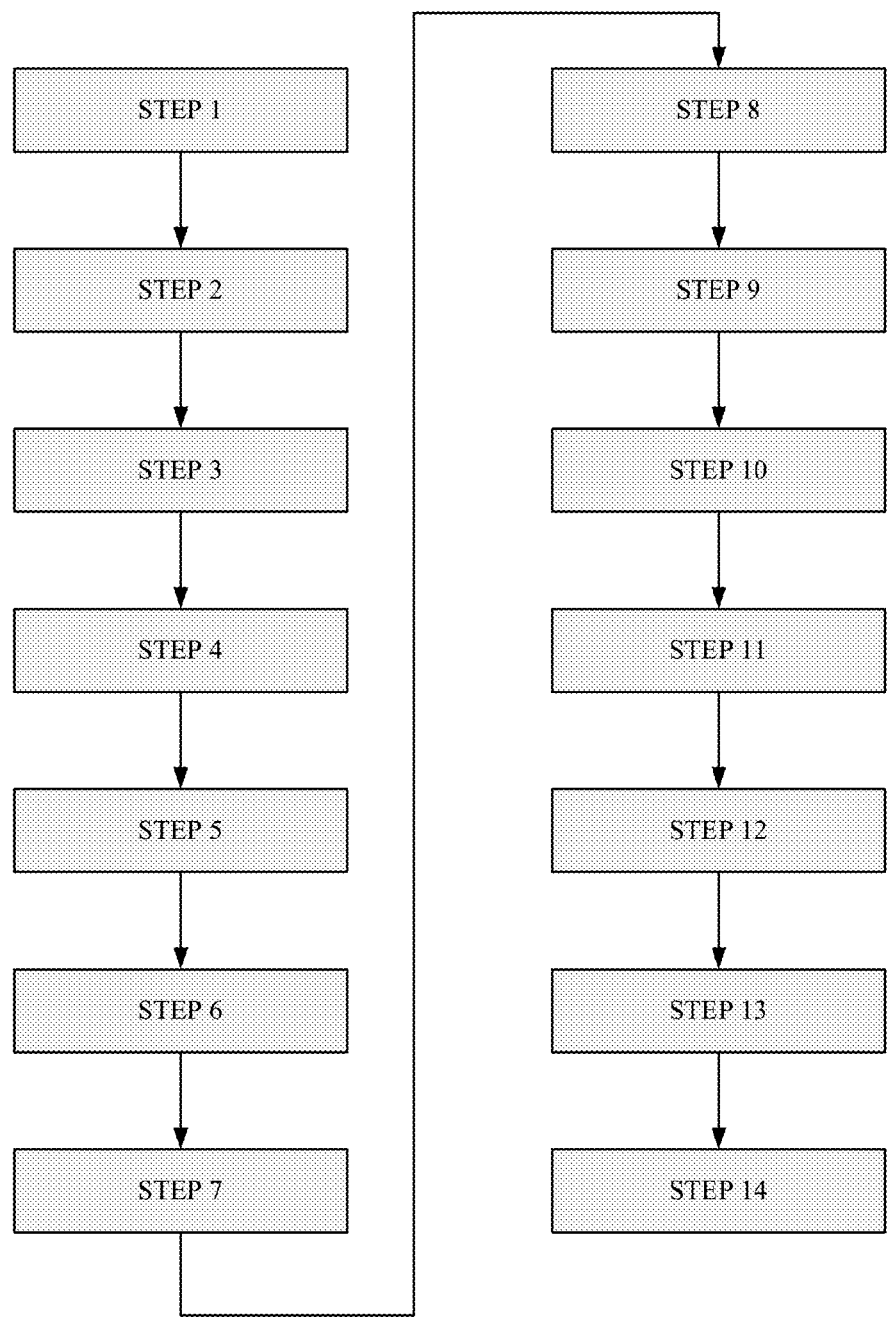
FIG. 1 shows respective steps of a method for forming a molecular level $SiO_2$ interface layer for a CMOS device according to an embodiment of the present disclosure.

The present disclosure provides a method for forming and controlling a molecular level $SiO_2$ interface layer for a CMOS device. The method is described with reference to FIG. 1. As shown in FIG. 1, the method mainly comprises:

Step 1) a cleansing step including, after completing of local oxide isolation or shallow trench isolation in Gate-First process or removing replaced gate in Gate-Last process and before forming an interface oxide layer, cleansing a wafer and immersing the wafer in HF/isopropyl alcohol/water solution at room temperature, rinsing the wafer with deionized water, spinning the wafer and then putting the wafer into a furnace immediately, wherein a volume ratio of HF:isopropyl alcohol:water is 0.15-1.5%:0.01-0.10%:1%, and the wafer is immersed for 1-8 minutes;

Step 2) forming the molecular level $SiO_2$ interface layer by performing rapid thermal annealing on the wafer optionally in super pure $N_2$ for 30-90 seconds at 500-600° C. in the Gate-Last process or at 600-800° C. in the Gate-First process, the $SiO_2$ interface layer having a thickness of 0.5-0.7 nm;

Step 3) forming a high-K gate dielectric film by forming the high-K gate dielectric film by physical vapor deposition (PVD) or atom layer deposition (ALD), the high-K gate dielectric film having a thickness of 2-5 nm and comprising one of various high-K gate dielectric films, including a HfLaON film, a HfSiON film, and a HfSiAlON film (the high-K gate dielectric film is well known in the art and a detailed description thereof is omitted);

Step 4) performing ultrasound cleansing, whereby the product of the step 3) is subjected to ultrasound cleansing first with acetone for 5-10 minutes and then with absolute ethyl alcohol for 5-10 minutes and then is rinsed by deionized water and spun in $N_2$;

Step 5) performing rapid thermal annealing, whereby the rapid thermal annealing is conducted in super pure $N_2$ at 500-600° C. for 30-90 seconds in the Gate-Last process or at 800-1000° C. for 20-40 seconds in the Gate-First process. The Gate Last process means that the metal gate/high-K dielectric/$SiO_2$ interface layer gate stack is formed after the formation of the source/drain regions; while the Gate-First process means that the metal gate/high-K dielectric/$SiO_2$ interface layer gate stack is formed before the formation of the source/drain regions.

Step 6) forming the CMOS metal gate by depositing a metal nitride gate having a thickness of 3-40 nm on the high-K dielectric layer by reactive magnetic sputtering by PVD, wherein the metal nitride gate according to the present disclosure may be one of a TiN gate, a TaN gate, a MoN gate, a MoAlN gate, a TiAlN gate, and a TiGaN gate, which is well known in the art and thus a detailed description thereof is omitted;

Step 7) depositing a barrier layer TaN or AlN on the CMOS metal gate by reactive magnetic sputtering, the barrier layer having a thickness of 4-6 nm;

Step 8) on the barrier layer, depositing a polysilicon film having a thickness of 50-120 nm by low-pressure chemical vapor deposition (LPCVD) in the Gate-First process or depositing a low-resistance metal film having a thickness of 50-120 nm by magnetic sputtering in the gate-Last process, wherein the low-resistance metal according to the present disclosure may be commonly-used metal such as Mo, W, and TiAl, a detailed description thereof being omitted;

Step 9) etching a product of the step 8) by plasma etching with Cl-base gas, F-base gas, or a mixture thereof, using a mask having a gate photolithography pattern, to form a polysilicon film/CMOS metal gate/high-K dielectric film/molecular level $SiO_2$ interface layer gate stack structure (the Gate-First process) or a CMOS metal gate/high-K dielectric film/molecular level $SiO_2$ interface layer gate stack structure (the Gate-Last process), respectively;

Step 10) depositing silicon nitride on a product of the step 9) by plasma chemical vapor deposition (PECVD) depositing at 300-400° C., the silicon nitride having a thickness of 200-600 Å;

Step 11) etching the silicon nitride by anisotropic plasma etching to form a first silicon nitride spacer;

Step 12) after source/drain extension implantation and forming a second spacer, performing source/drain implantation to form source/drain regions;

Step 13) activating the source/drain regions by rapid thermal annealing, wherein the rapid thermal annealing is performed at 950-1050° C. in $N_2$ for 1-15 seconds; and Step 14) forming contacts and metalizing by performing alloying annealing in $N_2$ or $N_2$+10% $H_2$ in an alloying furnace at 380-450° C. for 30-60 minutes.

Figure 2:
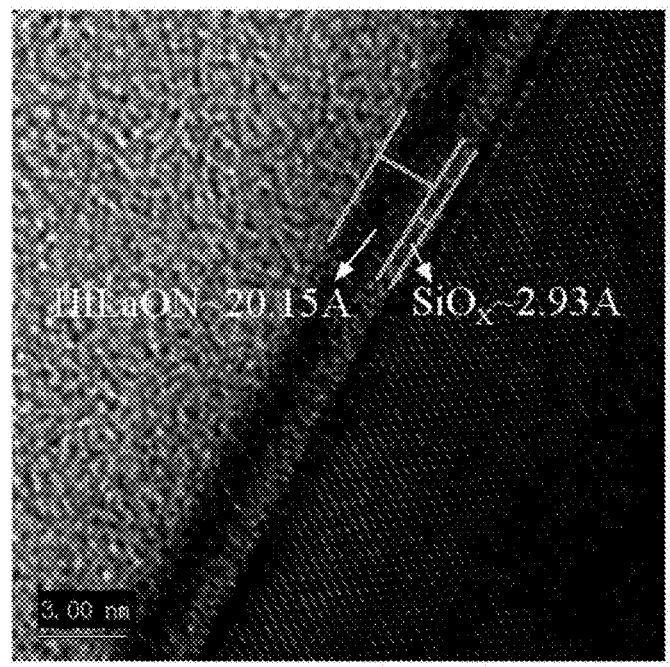
FIG. 2 shows an HRTEM photograph of a HfLaON/$SiO_2$ interface layer/Si structure having an EOT of 0.62 nm and a $SiO_2$ interface layer thickness of 0.29 nm.

FIG. 2 shows an HRTEM photograph of a HfLaON/$SiO_2$ interface layer/Si structure having an EOT of 0.62 nm and a $SiO_2$ interface layer thickness of 0.29 nm.

Figure 3:
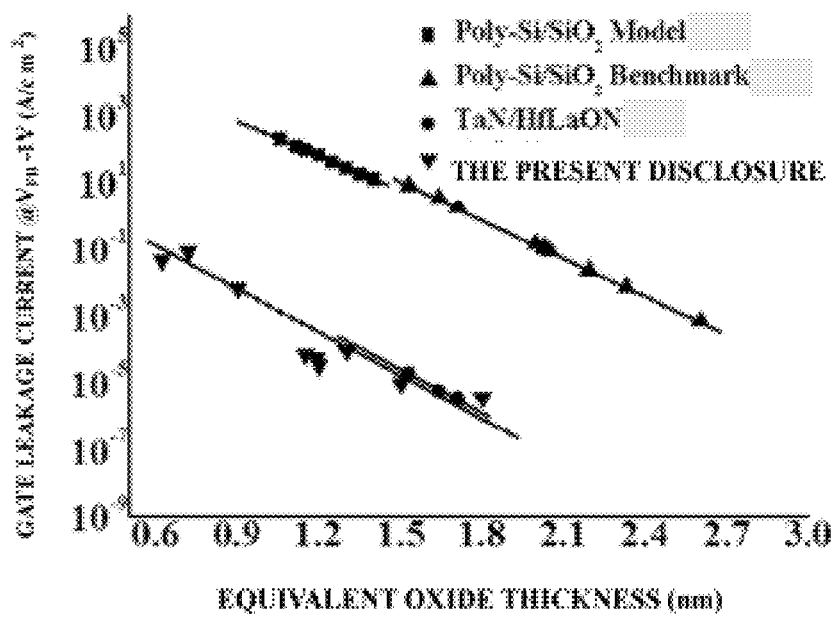
FIG. 3 shows a relationship between gate dielectric leakage current density and EOT of a TaN/HfLaON/$SiO_2$ interface layer structure, and a comparison with a poly-Si/$SiO_2$ gate structure. Under a same EOT, the gate dielectric leakage current of the TaN/HfLaON/$SiO_2$ interface layer structure is less than that of the poly-Si/$SiO_2$ gate structure by five orders.

FIG. 3 shows a relationship between gate dielectric leakage current density and EOT of a TaN/HfLaON/$SiO_2$ interface layer structure, and a comparison with a poly-Si/$SiO_2$ gate structure. Under a same EOT, the gate dielectric leakage current of the TaN/HfLaON/$SiO_2$ interface layer structure is less than that of the poly-Si/$SiO_2$ gate structure by five orders.

The present disclosure can achieve the following advantageous effects:

1) The surface cleansing method according to the present disclosure can suppress generation of natural oxide and contamination of particles, and improve Interface micro-roughness.

2) Ultra-thin $SiO_2$ interface layer growth technology. The $SiO_2$ interface layer is grown utilizing a trace of oxygen contained in super pure $N_2$ during rapid thermal annealing. The technology has a good repeatability and is a key technology in achieving the good-quality high-K gate dielectric film having the small EOT.

3) Rapid thermal annealing in super pure $N_2$ further strengthens the high-K gate dielectric and improves the gate leakage current and interface state. Meanwhile, this reduces the thickness of the $SiO_2$ interface layer by making the high-K gate dielectric to react with the $SiO_2$ interface layer.

4) The metal gate/high-K dielectric layer/$SiO_2$ interface layer gate stack structure is protected by a $Si_3N_4$ spacer-1 to avoid increasing of the EOT due to invasion of external oxygen atoms through side faces of the gate stack.

The method for manufacturing and controlling the molecular level $SiO_2$ interface provided by the present disclosure can obtain a good-quality high-K gate dielectric film having a small EOT. The manufacturing process is simple and easy to integrate. It is compatible with planar CMOS process, and can satisfy requirement of high-performance nanometer level CMOS metal gate/high-K device of 45 nm and below.

What is claimed is:

1. A method for forming and controlling a molecular level $SiO_2$ interface layer for a CMOS metal gate/high-K dielectric layer device, comprising:
    1) a cleansing step including, after completing local oxide isolation or shallow trench isolation in Gate-First process or removing replaced gate in Gate-Last process and before forming an interface oxide layer, cleansing a wafer and immersing the wafer in HF/isopropyl alcohol/water solution at room temperature, rinsing the wafer with deionized water, spinning the wafer and then putting the wafer into a furnace immediately, wherein a volume ratio of HF:isopropyl alcohol:water is 0.15-1.5%:0.01-0.10%:1%;
    2) forming the molecular level $SiO_2$ interface layer by performing rapid thermal annealing on the wafer for 30-90 seconds in $N_2$ at 500-600° C. in the Gate-Last process or at 600-800° C. in the Gate-First process;
    3) forming a high-K gate dielectric film by forming the high-K gate dielectric film by physical vapor deposition or atom layer deposition, the high-K gate dielectric film comprising one of various high-K gate dielectric films;
    4) performing rapid thermal annealing, whereby the rapid thermal annealing is conducted at 500-600° C. for 30-90 seconds in the Gate-Last process or at 800-1000° C. for 20-40 seconds in the Gate-First process;
    5) forming the CMOS metal gate by depositing a metal nitride gate on the high-K dielectric film by reactive magnetic sputtering utilizing physical vapor deposition;
    6) depositing a barrier layer on the CMOS metal gate by reactive magnetic sputtering;
    7) on the barrier layer, depositing a polysilicon film by low-pressure chemical vapor deposition in the Gate-First process or depositing low-resistance metal by magnetic sputtering in the gate-Last process;
    8) etching a product of the step 7) by plasma etching with Cl-base gas, F-base gas, or a mixture thereof, using a mask having a gate photolithography pattern, to form a polysilicon film/CMOS metal gate/high-K dielectric film/molecular level $SiO_2$ interface layer gate stack structure or a CMOS metal gate/high-K dielectric film/molecular level $SiO_2$ interface layer gate stack structure, respectively;
    9) depositing silicon nitride on a product of the step 8) by plasma chemical vapor deposition at 300-400° C., the silicon nitride having a thickness of 200-600 Å;
    10) etching the silicon nitride by anisotropic plasma etching to form a first silicon nitride spacer;
    11) after source/drain extension implantation and forming a second spacer, performing source/drain implantation to form source/drain regions;
    12) activating the source/drain regions by rapid thermal annealing: the rapid thermal annealing is performed at 950-1050° C. in $N_2$ for 1-15 seconds; and
    13) forming contacts and metalizing by performing alloying annealing in $N_2$ or $N_2$+10% $H_2$ in an alloying furnace at 380-450° C.

2. The method according to claim 1, wherein the cleansing in the step 1) is performed before formation of the interface oxide layer, wherein the wafer is first cleansed by a conventional method and then is immersed in the HF/isopropyl alcohol/water solution at the room temperature.

3. The method according to claim 1, wherein in the step 2), the molecular level $SiO_2$ interface layer has a thickness of 0.5-0.7 nm.

4. The method according to claim 1, wherein in the step 3), the high-K gate dielectric film has a thickness of 2-5 nm.

5. The method according to claim 1, wherein in the step 3), the high-K gate dielectric film is one of a HfLaON film, a HfSiON film, and a HfSiAlON film.

6. The method according to claim 1, wherein in the step 5), the metal nitride gate has a thickness of 3-40 nm.

7. The method according to claim 1, wherein in the step 5), the metal nitride gate is one of a TiN gate, a TaN gate, a MoN gate, a MoAlN gate, a TiAlN gate, and a TiGaN gate.

8. The method according to claim 1, wherein in the step 6), the barrier layer has a thickness of 4-7 nm.

9. The method according to claim 1, wherein in the step 6), the barrier layer is a TaN layer or an AlN layer.

10. The method according to claim 1, wherein in the step 7), the polysilicon film has a thickness of 50-120 nm, the low-resistance metal film has a thickness of 50-120 nm, and the low-resistance metal film is one of a Mo film, a W film, and a TiAl film.

11. The method according to claim 4, wherein in the step 3), the high-K gate dielectric film is one of a HfLaON film, a HfSiON film, and a HfSiAlON film.

12. The method according to claim 6, wherein in the step 5), the metal nitride gate is one of a TiN gate, a TaN gate, a MoN gate, a MoAlN gate, a TiAlN gate, and a TiGaN gate.

13. The method according to claim 8, wherein in the step 6), the barrier layer is a TaN layer or an AlN layer.

\* \* \* \* \*